(12) United States Patent
Lee

(10) Patent No.: US 6,368,126 B1
(45) Date of Patent: Apr. 9, 2002

(54) CARD EDGE CONNECTOR WITH SAFETY EJECTOR

(75) Inventor: George Lee, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/742,145

(22) Filed: Dec. 19, 2000

(51) Int. Cl.[7] ............................................... H01R 13/62
(52) U.S. Cl. ........................................................ 439/160
(58) Field of Search ................................ 439/160, 159, 439/157, 372

(56) References Cited

U.S. PATENT DOCUMENTS

| | | | |
|---|---|---|---|
| 4,846,734 A | * | 7/1989 | Lytle |
| 5,074,800 A | * | 12/1991 | Sasao et al. |
| 5,167,517 A | * | 12/1992 | Long |
| 5,211,568 A | * | 5/1993 | Yamada |
| 5,302,133 A | * | 4/1994 | Tondreault |
| 5,364,282 A | * | 11/1994 | Tondreault |
| 5,672,069 A | * | 9/1997 | Cheng et al. ............. 439/160 |
| 5,730,611 A | * | 3/1998 | Cheng et al. ............. 439/160 |
| 6,030,239 A | * | 2/2000 | Liu ........................... 439/160 |
| 6,113,404 A | * | 9/2000 | Choy ........................ 439/160 |
| 6,132,228 A | * | 10/2000 | Lang ......................... 439/160 |
| 6,152,749 A | * | 11/2000 | Tseng et al. ............. 439/160 |

* cited by examiner

*Primary Examiner*—Gary Paumen
(74) *Attorney, Agent, or Firm*—Wei Te Chung

(57) ABSTRACT

A card edge connector (10) includes an elongated insulative housing (12) having a central slot (16) for receiving a memory card (100) therein, a pair of card ejectors (60) at respective opposite ends of the housing and two rows of contacts (14) received in the housing (12). The housing has a pair of towers (30) at the respective opposite ends thereof, each having a cavity (36) for movably receiving a corresponding ejector therein. Means for preventing over-rotation of the ejectors upon release of the received memory card include an inclined surface (74) in a slit (72) of each ejector and a stopping surface (48) of a pillar (44) in a corresponding cavity, and a pair of blocks (20) adjacent to a corresponding tower (30). The inclined surfaces of the ejectors abut against the corresponding stopping surfaces of the pillars and the ejectors abut against the blocks, thereby preventing overrotation of the respective ejectors.

1 Claim, 7 Drawing Sheets

CARD EDGE CONNECTOR WITH SAFETY EJECTOR

BACKGROUND OF THE INVENTION

1. Field of the Invention

The invention relates to a card edge connector, and particularly to a card edge connector having card ejectors on opposite ends thereof and means for preventing such ejectors from over rotation which releasing a card therefrom.

2. The Related Art

Dual In-line Memory Modules (DIMMs) are becoming more and more popular in the computer industry. A DIMM socket connector is mounted on a computer mother board for mechanical and electrical connection to a corresponding DIMM. Typical DIMM connectors are found in U.S. Pat. Nos. 5,074,800, 5,167,517, 5,211,568, 5,302,133 and 5,364,282. The main distinguishing feature of a typical DIMM connector in comparison with a conventional card edge connector is shown in U.S. Pat. No. 4,846,734. Namely, a DIMM connector generally includes a pair of latch/eject members at respective opposite ends. Thus a DIMM is not only securely retained in the DIMM connector with negligible risk of displacement by vibration or shock, but is also easily ejected from the DIMM connector by rotational movement of the latch/eject members.

However, the latch/eject members can easily be over-rotated, resulting in damage to other components on the mother board. Conventional DIMM connectors have inferior means for preventing the latch/ejector members from being over-rotated. Hence, an improved DIMM connector having such means is desired.

SUMMARY OF THE INVENTION

An object of the invention is to provide a card edge connector having not only ejectors at opposite ends thereof for releasably latching a memory card engaged therein but also ejector over-rotation prevention means for ensuring safe ejection of the memory card from the connector.

To obtain the above object, a card edge connector comprises an elongated insulative housing having a pair of towers at respective opposite ends thereof, a plurality of contacts received in the housing, and a pair of rotatable ejectors respectively received in cavities defined in the towers. The housing defines a central slot in a mating surface thereof and the contacts in the housing partially extend into the central slot for electrically connecting with opposite side faces of a memory card engaged in the slot. Each tower defines an opening at a top portion thereof communicating with the cavity thereof for entrance of the corresponding ejector. A pillar upwardly extends from a bottom wall of the tower into the corresponding cavity and has a stopping surface at a top end thereof. The ejectors each include a lever and an eject portion at a bottom end of the lever for releasing the engaged memory card from the connector. Each lever has a pair of opposite side pieces at the bottom end thereof and a slit defined between the pair of opposite side pieces. An inclined surface is defined at a top periphery of the slit relative to a bottom surface of the bottom end. The slit has such a size that the pillar of the tower is movably received therein and is sandwiched between the pair of side pieces of the lever. When a force is applied outwardly against the levers, the ejectors each rotate outward a desired angle sufficient for completely release the memory card from the connector. In this card ejecting position, the inclined surfaces of the ejectors timely abut against the stopping surfaces of corresponding pillars of the towers to prevent the ejectors from rotating outward a further angle, thereby limiting over-rotation of the ejectors.

Other objects, advantages and novel features of the invention will become more apparent from the following detailed description of the present embodiment when taken in conjunction with the accompanying drawings.

DETAILED DESCRIPTION OF THE INVENTION

Figure 1:
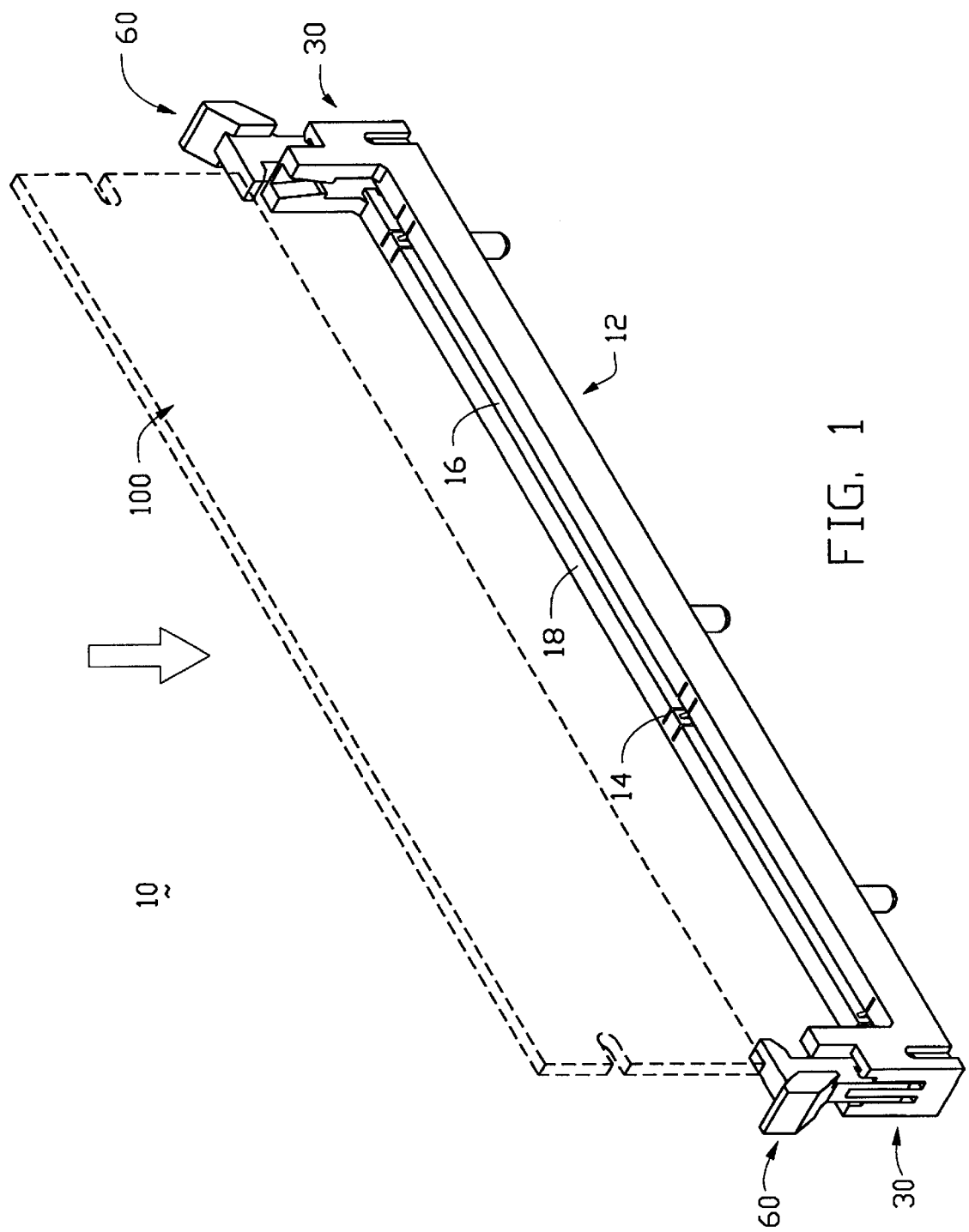
FIG. 1 is a perspective view of a card edge connector of the present invention, together with a memory card for insertion into the connector in the direction of the large arrow.

Referring to FIG. 1, a card edge connector 10 of the present invention comprises an elongated insulative housing 12 having a pair of towers 30 at respective opposite ends thereof, a plurality of contacts 14 received in the housing 12, and a pair of ejectors 60 rotatably located in the respective towers 30 for releasing a memory card 100 engaged in the connector 10. The housing 12 has a central slot 16 defined in a mating surface 18 thereof for engaging an edge of the memory card 100 therein. The contacts 14 in the housing 12 partially extend into the slot 16 for electrically connecting with opposite side faces of the edge of the memory card 100 (best seen in FIG. 2).

Figure 2:
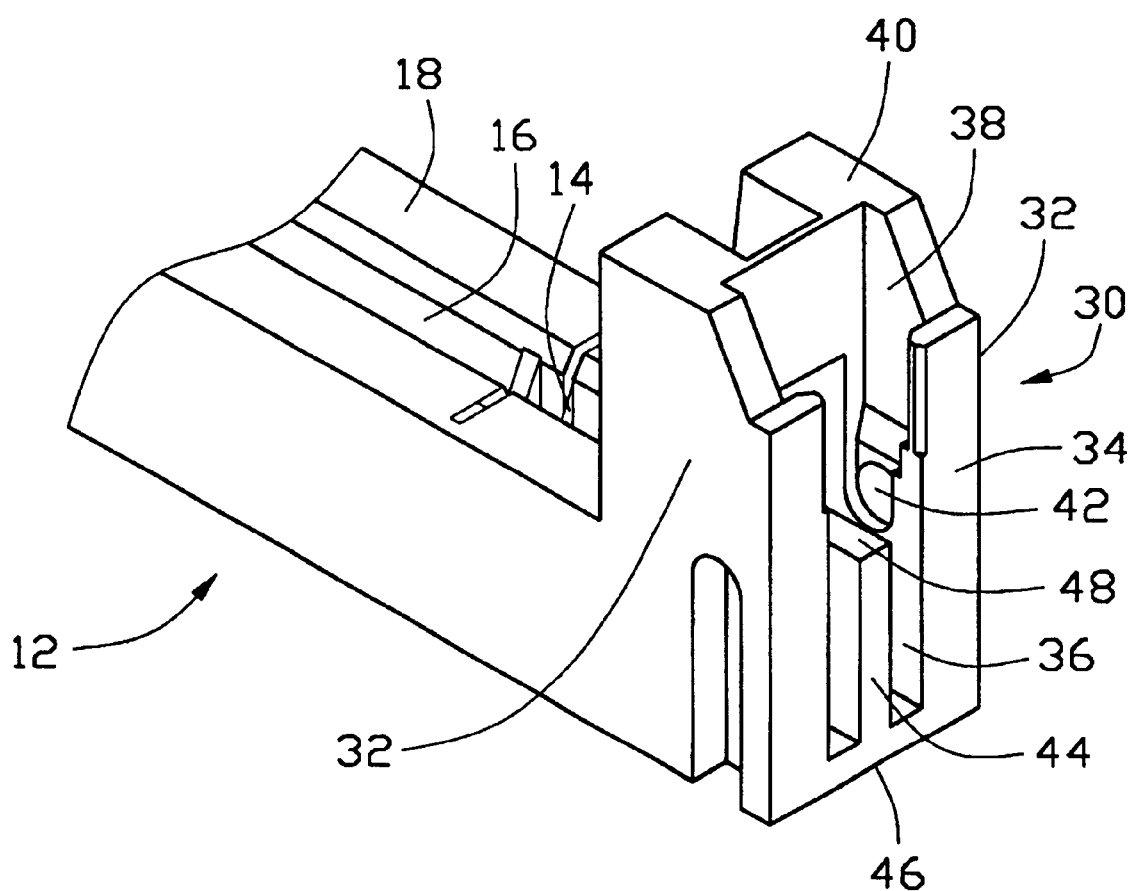
FIG. 2 is an enlarged perspective view of one end of a dielectric housing of FIG.1 looking from a front and right-hand viewpoint.
Figure 3:
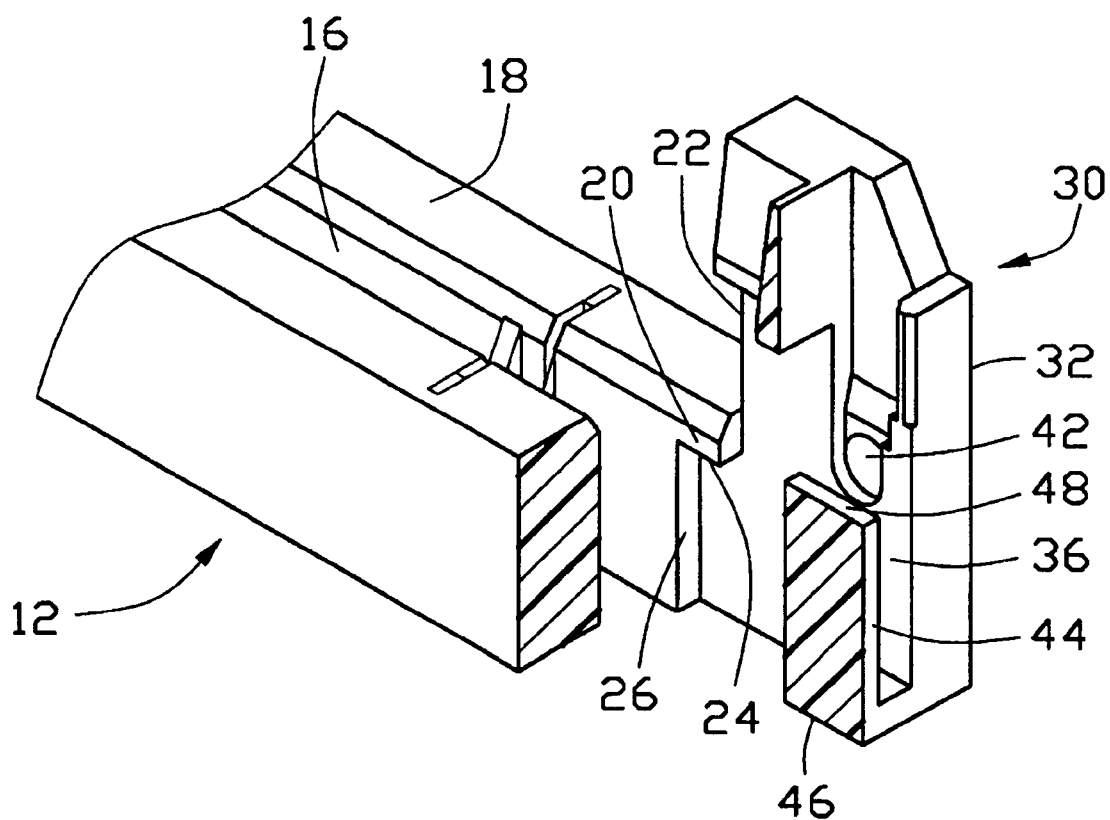
FIG. 3 is similar to FIG. 2, but the end of the housing is partially cross-sectioned.

Referring to FIGS. 2 & 3, particularly, the towers 30 each have a pair of opposite side walls 32, an end wall 34 between outward edges of the side walls 32 and a cavity 36 between the side walls 32 and the end wall 34 for accommodating the ejector 60. The end wall 34 of each tower 30 defines an opening 38 in a top portion 40 thereof communicating with the cavity 36, for entrance of the corresponding ejector 60. The side walls 32 each define a through hole 42 for rotatably supporting the ejector 60, which is well known in the art. Each tower 30 further has a pillar 44 upwardly extending from a bottom wall 46 thereof into the cavity 36. Each pillar 44 has a stopping surface 48 at a top end thereof generally parallel to the mating surface 18 of the housing 12.

As is best seen in FIG. 3, the housing 12 further forms an engaging block 20 adjacent to an inward edge 22 of each side wall 32 of each tower 30. Each engaging block 20 has a generally horizontal engaging surface 24 adapted to limit over-rotation of the corresponding ejector 60. A vertical surface 26 is defined generally perpendicular to the horizontal engaging surface 24 adapted to allow rotation of the ejector 60.

Figure 4:
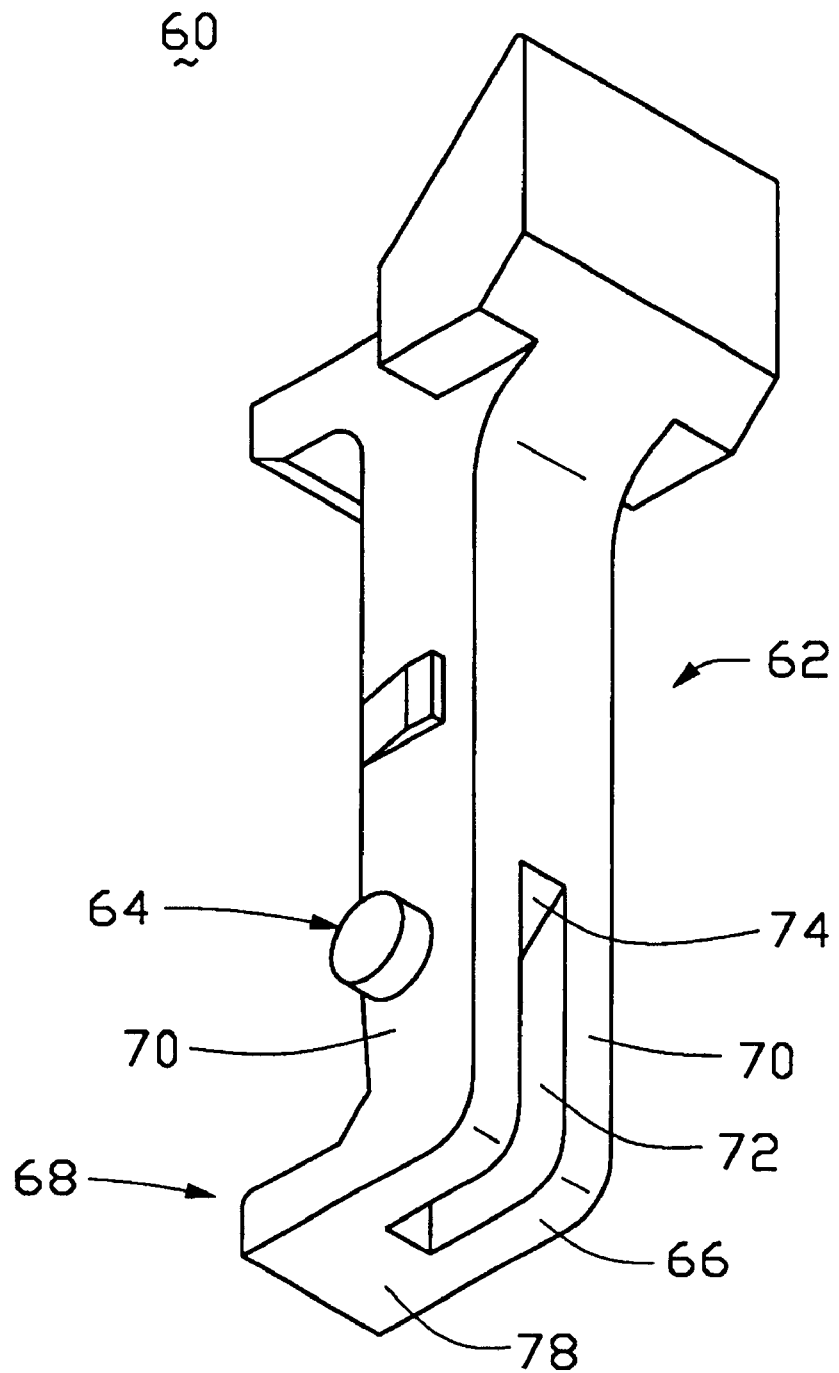
FIG. 4 is an enlarged perspective view of an ejector of FIG. 1 looking from a bottom and right-hand viewpoint.
Figure 5:
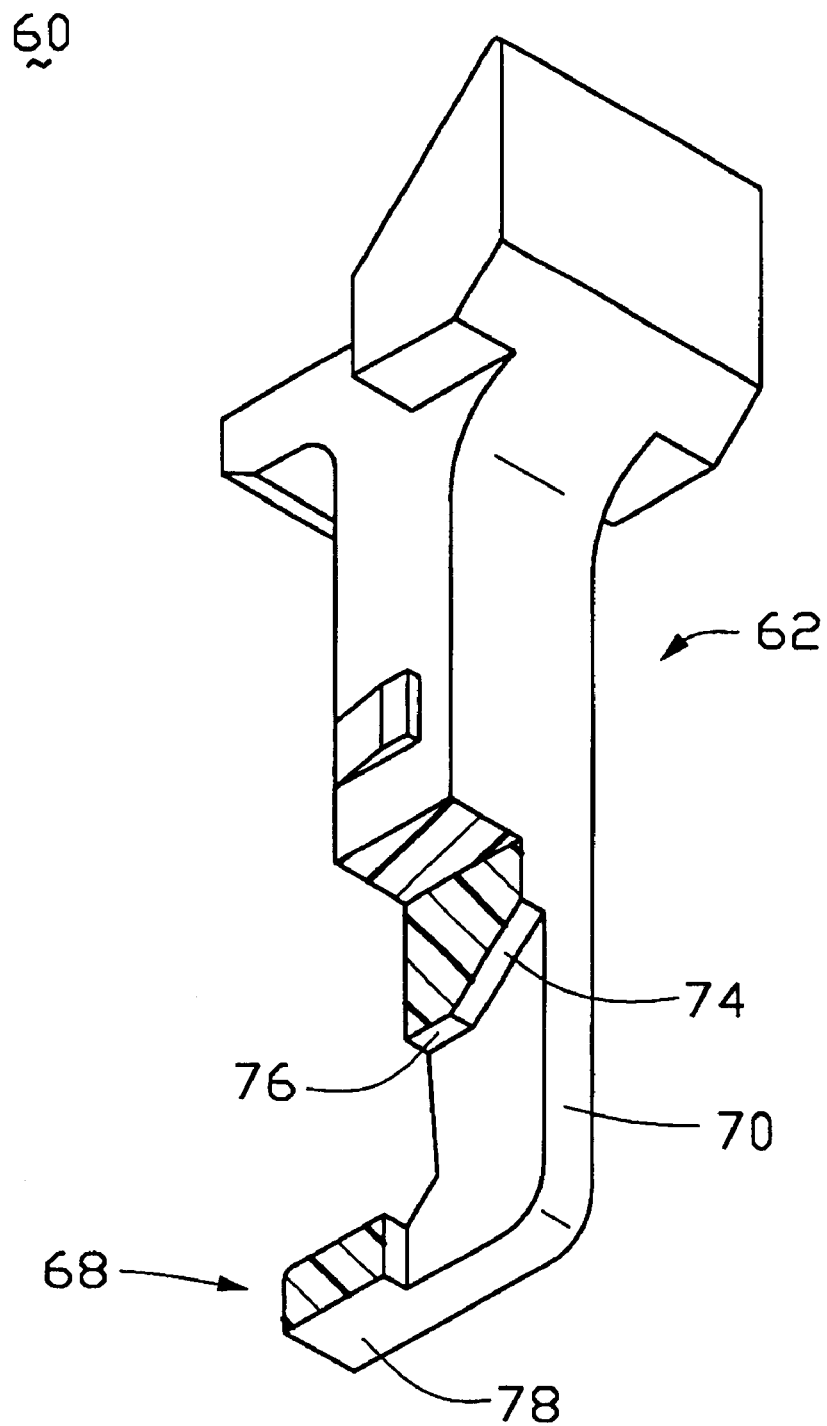
FIG. 5 is similar to FIG. 4, but a bottom portion of the ejector is partially cross-sectioned.

Referring particularly to FIGS. 4 & 5, each ejector 60 comprises a lever 62 for rotatably operating the ejector 60, a pair of pivots 64 at respective opposite sides of the lever 62 and adjacent to a bottom end 66 of the lever 62, and an eject portion 68 extending perpendicularly inwardly from the bottom end 66 of the lever 62. The bottom end 66 of the lever 62 has a pair of opposite side pieces 70 and a slit 72 defined between the pair of side pieces 70. An inclined surface 74 and a horizontal surface 76 are defined at a top periphery of the slit 72 such that, when viewed from the perspective of FIG. 5, the slit 72 becomes gradually smaller from the right-hand to the left-hand of the drawing sheet. The horizontal surface 76 is generally parallel to a bottom surface 78 of the ejector 60.

Figure 6:
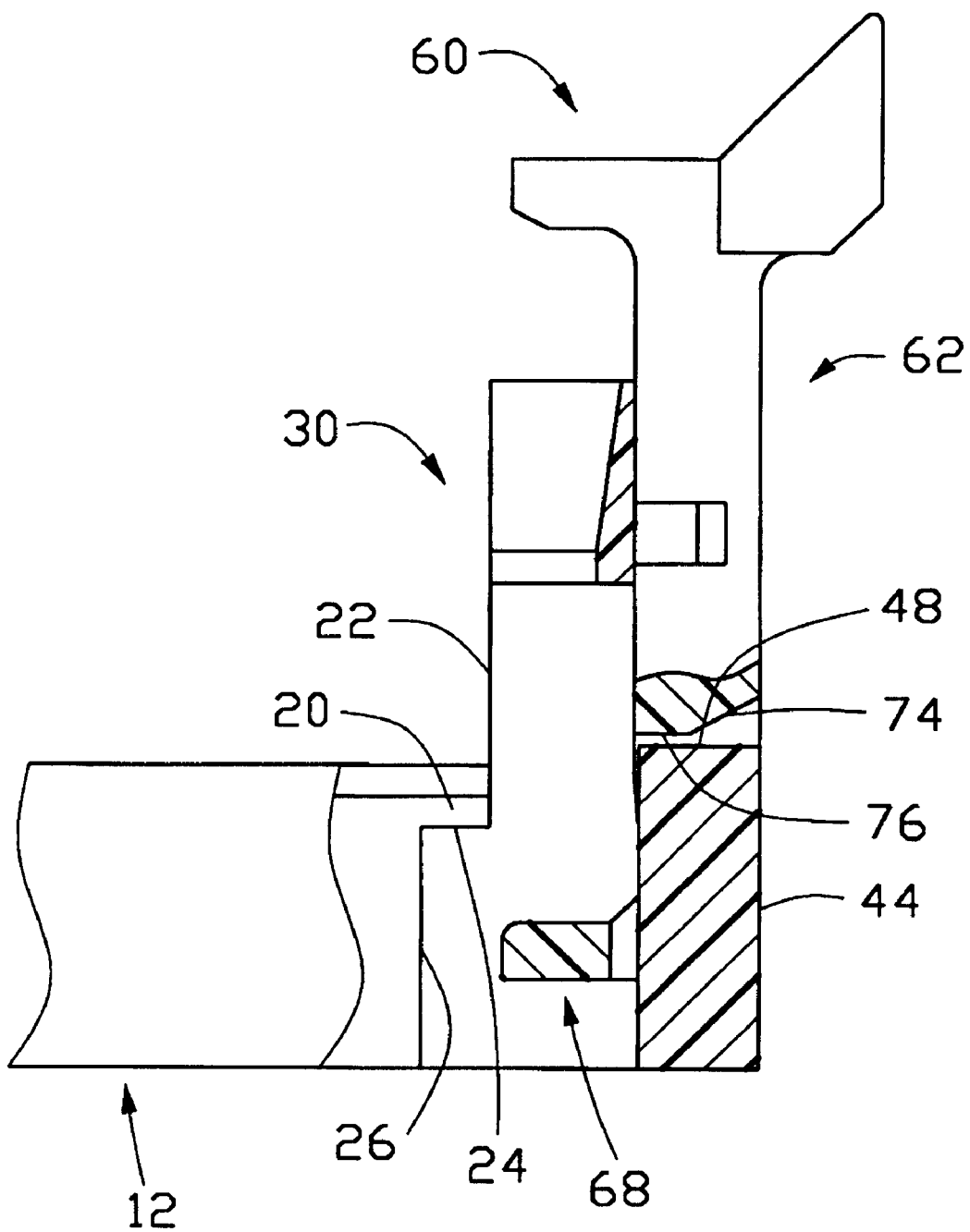
FIG. 6 is an enlarged side view of an assembly of the cross-sectioned end of FIG. 3 and the cross-sectioned ejector of FIG. 5 with the ejector attached to the housing in an upright position.
Figure 7:
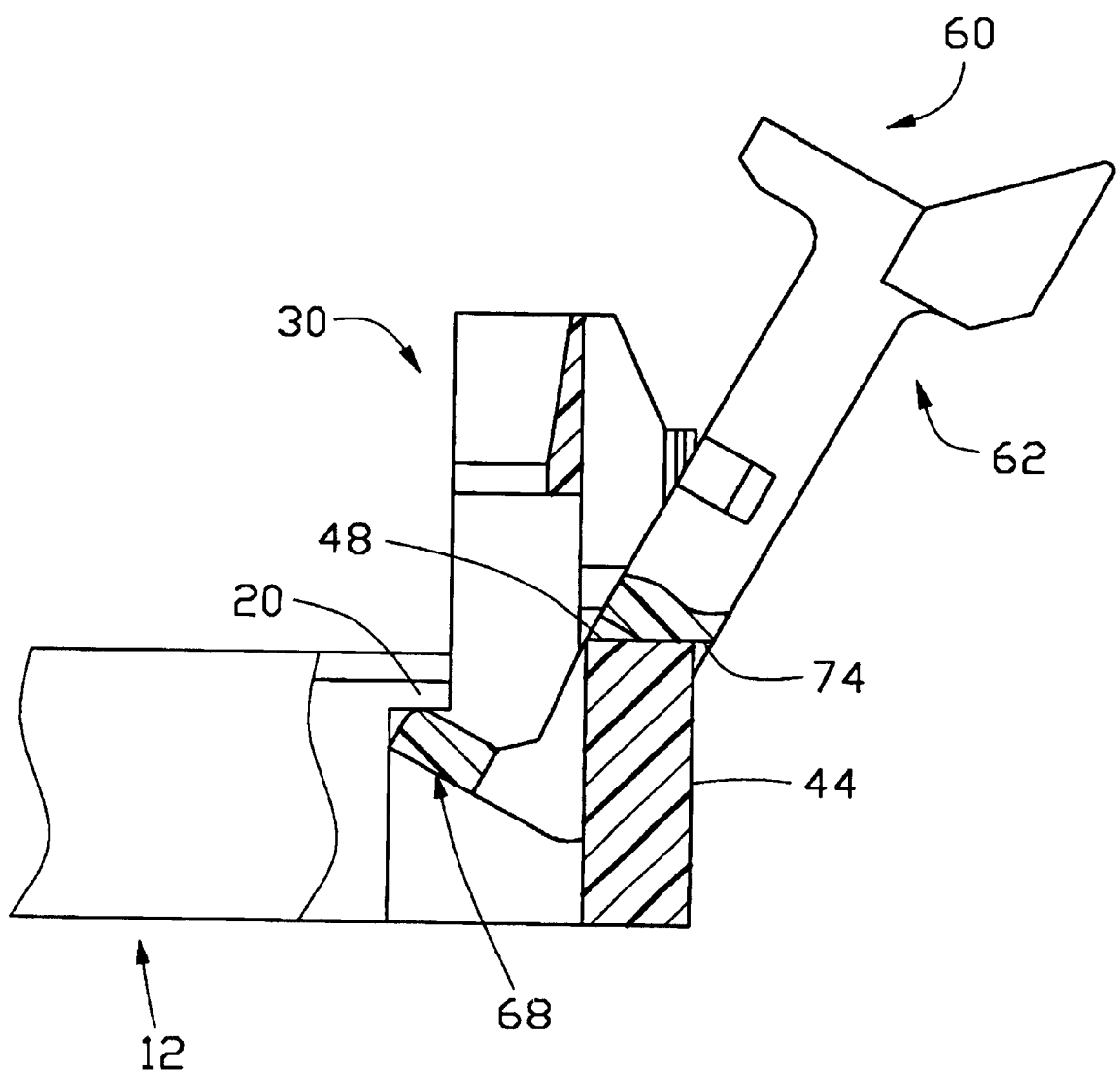
FIG. 7 is similar to FIG. 6, but with the ejector rotated outwardly as far as it can go.

Referring also to FIGS. 6–7, in assembly, the pair of ejectors 60 is inserted via the openings 38 into the respective cavities 36 of the towers 30. The ejectors 60 are moved downwardly until the pivots 64 are rotatably received in the corresponding through holes 42 of the tower 30. The slit 72 of each ejector 60 has such a size that the pillar 44 of the corresponding tower 30 is movably received in the slit 72 and is sandwiched between the pair of side pieces 70 of the ejector 60. The eject portion 68 of each ejector 60 is located in a lower portion of the cavity 36. When the ejectors 60 are attached to the corresponding towers 30 of the housing 12 and are positioned in an upright position, the inclined surface 74 and the horizontal surface 76 of each ejector 60 do not prevent rotation of the corresponding ejectors 60. When the ejectors 60 are rotated by an outwardly directed force against the levers 62 to angle sufficient to completely release the engaged memory card 100 from the connector 10 via the eject portions 68, the inclined surfaces 74 abut against the stopping surfaces 48 of the corresponding pillars 44 of the towers 30, thereby preventing the ejectors 60 from over-rotation. In this position, the engaging blocks 20 also abut against the eject portion 68 of the corresponding ejector 60 to further prevent the corresponding ejector 60 from over-rotation.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for safely release an electronic card engaged therein comprising:

an elongated insulative housing defining a central slot in a mating surface thereof, the slot being adapted to receive the electronic card therein;

a plurality of contacts received in the housing, for electrical and mechanical engagement with the electronic card in the housing;

at least one tower formed at one end of the housing, each tower having a cavity and a pillar in the cavity, the pillar having a stopping surface at a top end thereof; and at least one card ejector movably received in the cavity of the at least one tower, the at least one card ejector having an operation lever and a card eject portion at a bottom end of the operation lever, the at least one card ejector defining a slit at the bottom end thereof movably receiving the pillar of the at least one tower therein, the slit having a top periphery adapted to abut against the stopping surface of the pillar to limit rotation of the at least one card ejector upon the at least one card ejector completely releasing the electronic card from the connector;

wherein the top periphery of the slit has an inclined surface relative to a bottom surface of the ejector for abutting against the stopping surface of the pillar to prevent the at least one card ejector from outward over-rotation;

wherein the top periphery of the slit further has a horizontal surface for allowance of the inward rotation of the at least one card ejector;

wherein the at least one tower has a bottom wall and the pillar upwardly extends from the bottom wall into the corresponding cavity;

wherein the stopping surface of the pillar is generally parallel to the mating surface of the housing;

wherein the housing further includes a plurality of engaging blocks, each adjacent to an inward edge of each of two side walls of each tower, each engaging block having a horizontal engaging surface for abutting against the eject portion of the at least one card ejector;

wherein each engaging block further has a vertical surface perpendicular to the horizontal engaging surface, the vertical surface being adapted to allow rotation of the at least one card ejector.

* * * * *